United States Patent
Tsai

(10) Patent No.: US 7,745,837 B2
(45) Date of Patent: Jun. 29, 2010

(54) SEMICONDUCTOR LIGHT-EMITTING DEVICE WITH HIGH LIGHT-EXTRACTION EFFICIENCY AND METHOD FOR FABRICATING THE SAME

(75) Inventor: Tzong-Liang Tsai, Taichung (TW)

(73) Assignee: Huga Optotech Inc., Taichung (TW)

( * ) Notice: Subject to any disclaimer, the term of this patent is extended or adjusted under 35 U.S.C. 154(b) by 174 days.

(21) Appl. No.: 12/000,064

(22) Filed: Dec. 7, 2007

(65) Prior Publication Data
US 2009/0045419 A1    Feb. 19, 2009

(30) Foreign Application Priority Data
Aug. 15, 2007    (TW) .............. 96130075 A

(51) Int. Cl.
*H01L 29/167*    (2006.01)
(52) U.S. Cl. .............. 257/86; 257/87; 257/98; 257/E25.032; 438/29; 438/69
(58) Field of Classification Search ............... None
See application file for complete search history.

(56) References Cited
U.S. PATENT DOCUMENTS
2007/0085093 A1*   4/2007   Ohmae et al. ............ 257/89

OTHER PUBLICATIONS

NIST, National Institute of Standards and Technology, Document SP 966, Sep. 2003.*

* cited by examiner

*Primary Examiner*—Evan Pert
*Assistant Examiner*—Scott R Wilson
(74) *Attorney, Agent, or Firm*—Chun-Ming Shih

(57) ABSTRACT

The invention discloses a semiconductor light-emitting device and a method of fabricating the same. The semiconductor light-emitting device according to the invention includes a substrate, a first semiconductor material layer, a multi-layer structure and an ohmic electrode structure. The substrate has a first upper surface and a plurality of recesses formed on the first upper surface. The first semiconductor material layer is formed on the first upper surface of the substrate and has a second upper surface. The multi-layer structure is formed on the second upper surface of the first semiconductor material layer and includes a light-emitting region. The ohmic electrode structure is formed on the multi-layer structure. In particular, the first semiconductor material layer has a refractive index different from those of the substrate and a bottom-most layer of the multi-layer structure.

24 Claims, 8 Drawing Sheets

SEMICONDUCTOR LIGHT-EMITTING DEVICE WITH HIGH LIGHT-EXTRACTION EFFICIENCY AND METHOD FOR FABRICATING THE SAME

BACKGROUND OF THE INVENTION

1. Field of the Invention

The present invention relates to a semiconductor light-emitting device, and more particularly, to a semiconductor light-emitting device with high light-extraction efficiency.

2. Description of the Prior Art

Nowadays, semiconductor light-emitting devices, such as light-emitting diodes, have been used for a variety of applications, e.g., illumination and remote control. To ensure high functional reliability and a low power requirement of the semiconductor light-emitting devices as far as possible, the semiconductor light-emitting devices itself is required for the external quantum efficiency.

In theory, the external quantum efficiency of a semiconductor light-emitting device is determined by the internal quantum efficiency and the light-extraction efficiency of the semiconductor light-emitting device. The internal quantum efficiency is determined by the material property and quality. If the density of the internal defects, such as dislocations, of the semiconductor light-emitting device increases, the internal quantum efficiency of the semiconductor light-emitting device decreases. However, on the condition that the internal quantum efficiency can not be increased efficiently, the importance for the increase of the light-extraction efficiency is emphasized.

The increase of the light-extraction efficiency is for guiding the light emitted from the inside of the semiconductor light-emitting device to the outside of the semiconductor light-emitting device. If the moving direction of the light inside the semiconductor light can be continuously changed to decrease the total reflection probability, the light can be prevent from being limited inside the semiconductor light-emitting device, so as to further increase the light-extraction efficiency of the semiconductor light-emitting device.

SUMMARY OF THE INVENTION

A scope of the invention is to provide a semiconductor light-emitting device and a method for fabricating the same.

According to an embodiment of the invention, the semiconductor light-emitting device includes a substrate, a first semiconductor material layer, a multi-layer structure and an ohmic electrode structure.

The substrate has a first upper surface and a plurality of recesses formed on the first upper surface. The first semiconductor material layer is formed on the first upper surface and has a second upper surface. The multi-layer structure is formed on the second upper surface of the first semiconductor material layer and has a light-emitting region. The ohmic electrode structure is formed on the multi-layer structure.

Particularly, the refractive index of the first semiconductor material layer is different from those of the substrate and the bottom-most layer of the multi-layer structure.

According to another embodiment of the invention, a method for fabricating a semiconductor light-emitting device is provided.

At first, a substrate is prepared in the method. The substrate has a first upper surface and a plurality of recesses formed on the first upper surface. Afterwards, a first semiconductor material layer is formed on the first upper surface of the substrate in the method. The first semiconductor has a second upper surface. And then, a multi-layer structure is formed on the second upper surface of the first semiconductor material layer in the method. The multi-layer structure includes a light-emitting region. At last, an ohmic electrode structure is formed on the multi-layer structure.

Compared to the prior art, the semiconductor light-emitting device of the invention can change the moving direction of the light inside the semiconductor light-emitting device to decrease total reflection probability according to differences among different semiconductor material layers. Accordingly, the light-extraction efficiency of the semiconductor light-emitting device of the invention can be increased efficiently.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
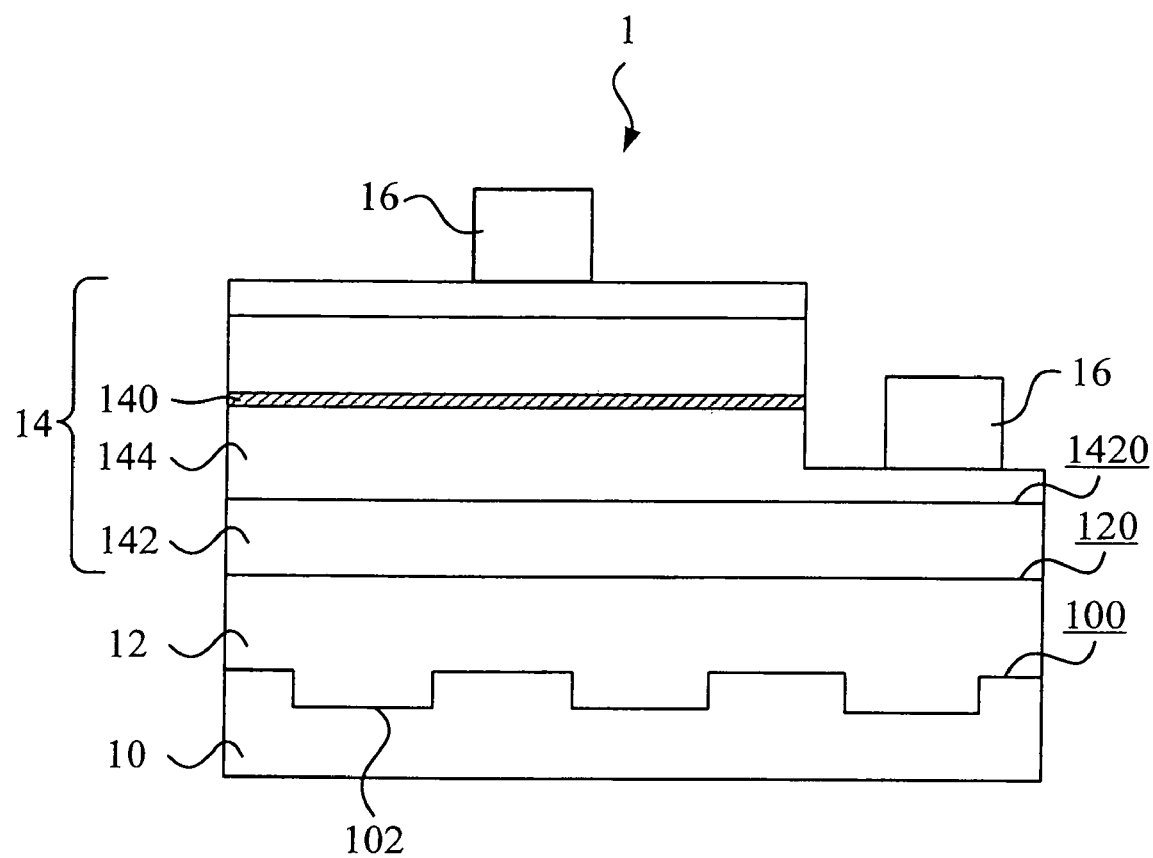
FIG. 1 is a section view illustrating a semiconductor light-emitting device according to an embodiment of the invention.

Please refer to FIG. 1. FIG. 1 is a section view illustrating a semiconductor light-emitting device 1 according to an embodiment of the invention.

As shown in FIG. 1, the semiconductor light-emitting device 1 includes a substrate 10, a first semiconductor material layer 12, a multi-layer structure 14 and an ohmic electrode structure 16.

In particular, the substrate 10 can be $SiO_2$, Si, Ge, GaN, GaAs, GaP, AlN, sapphire, spinnel, $Al_2O_3$, SiC, ZnO, MgO, $LiAlO_2$, $LiGaO_2$, and $MgAl_2O_4$.

The substrate 10 has a first upper surface 100 and a plurality of recesses 102 formed on the first upper surface 100. The first semiconductor material layer 12 is formed on the first upper surface 100 of the substrate 10 and has a second upper surface 120. The multi-layer structure 14 is formed on the second upper surface 120 of the first semiconductor material layer 12 and includes a light-emitting region 140. The ohmic electrode structure 16 is formed on the multi-layer structure 14.

In the embodiment, the first semiconductor material layer 12 can be a II-V group compound, a II-VI group compound, or a III-V group compound.

If the first semiconductor material layer 12 is the II-V group chemical element, a II group compound in the II-V group compound can be Zn, Be, Mg, Ca, Sr, Ba, or Ra, and a V group chemical element in the II-V group compound can be N, P, or As.

If the first semiconductor material layer 12 is the II-VI group chemical element, a II group compound in the II-V group compound can be Zn, Be, Mg, Ca, Sr, Ba, or Ra, and a VI group chemical element in the II-VI group compound can be O, S, Se, Te, or Po.

If the first semiconductor material layer 12 the III-V group chemical element, a III group compound in the II-V group compound can be Al, Ga, or In, and a V group chemical element in the II-V group compound can be N, P, or As.

Particularly, the refractive index of the first semiconductor material layer 12 is different from those of the substrate 10 and the bottom-most layer of the multi-layer structure 14. The differences among the refractive indices of the substrate 10, the first semiconductor material layer 12 and the bottom-most layer are for changing the moving direction of the light emitted from the light-emitting region 140 to decrease total reflection probability, so as to prevent the light from being limited inside the semiconductor light-emitting device 1, in other words, to increase the light-extraction efficiency of the semiconductor light-emitting device 1.

Figure 2:
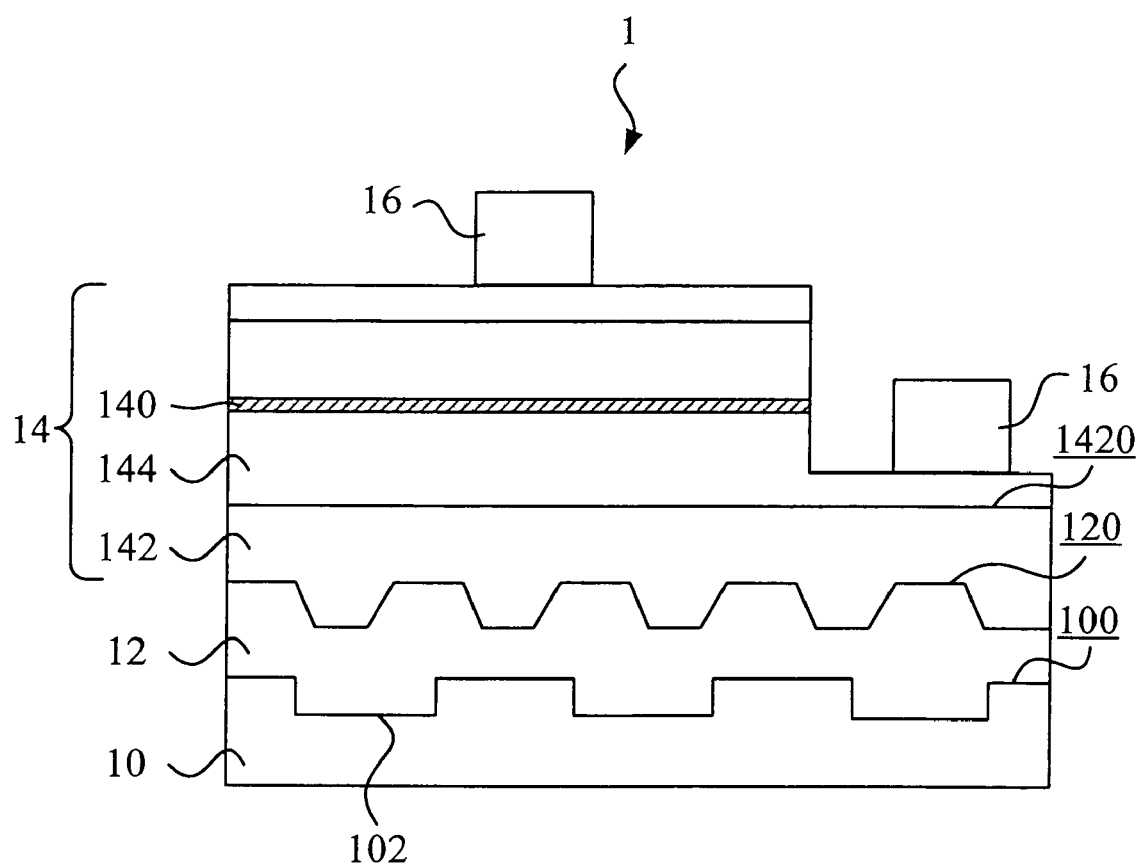
FIG. 2 is a section view illustrating a semiconductor light-emitting device according to another embodiment of the invention

Please refer to FIG. 2. FIG. 2 is a section view illustrating a semiconductor light-emitting device 1 according to another embodiment of the invention.

As shown in FIG. 2, the second upper surface 120 of the first semiconductor material layer 12 can further be rough. In the aspect of function, the rough second upper surface 120 can further increase the refractive frequency of the light to change the moving direction thereof.

In particular, the profile of the second upper surface 120 can present regular or irregular patterns. In this embodiment, the profile of the second upper surface 120 present but is not limited to a trapezoid.

In an embodiment, for different light (e.g., distinguishing by wavelength), a thickness of the first semiconductor material layer 12 can be determined according to the refractive indices of the substrate 10, the first semiconductor material layer 12, and the bottom-most layer. The design of the thickness is used for achieving optimum light-extraction efficiency for different light.

Please refer to FIG. 1 again. In an embodiment, the bottom-most layer of the multi-layer structure 14 can be regarded as a second semiconductor material layer 142. The second semiconductor material layer 142 has a third upper surface 1420. The second semiconductor material layer 142 can also be a II-V group compound, a II-VI group compound, or a III-V group compound.

Similarly, the refractive index the second semiconductor material layer 142 is different from those of a bottom-next layer 144 of the multi-layer structure 14 and the first semiconductor material layer 12.

On the basis of the same principle, the differences among the refractive indices of the bottom-next layer 144, the second semiconductor material layer 142, the first semiconductor material layer 12, and the substrate 10 are for increasing the light-extraction efficiency of the semiconductor light-emitting device 1.

Figure 3:
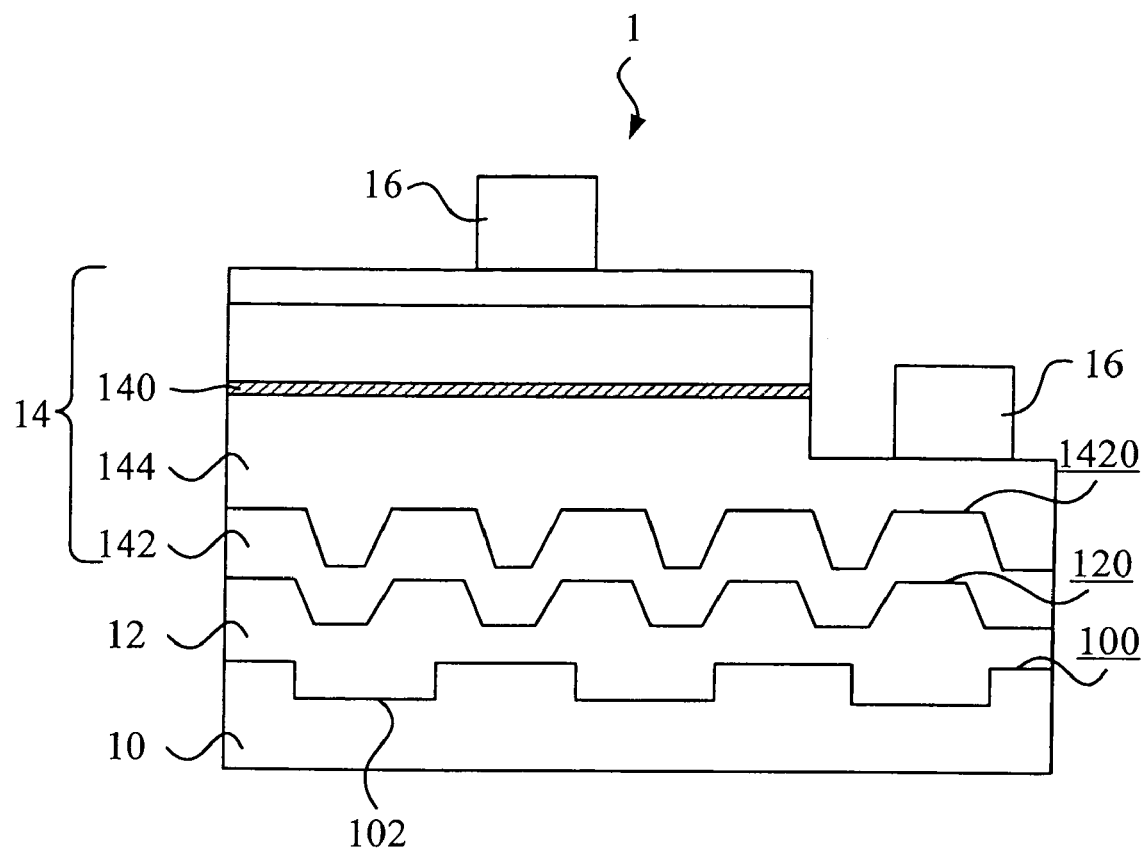
FIG. 3 is a section view illustrating a semiconductor light-emitting device extended from FIG. 2 according to another embodiment of the invention.

Please refer to FIG. 3. FIG. 3 is a section view illustrating a semiconductor light-emitting device 1 extended from FIG. 2 according to another embodiment of the invention.

As shown in FIG. 3, the third upper surface 1420 of the second semiconductor material layer 142 can further be rough. In the aspect of function, the rough third upper surface 1420 also can further increase the refractive frequency of the light to change the moving direction thereof.

In particular, the profile of the third upper surface 1420 also can present regular or irregular patterns. In this embodiment, the profile of the third upper surface 1420 present but is not limited to the same pattern with the second upper surface 120 (i.e., a trapezoid).

In an embodiment, for the optimum light-extraction efficiency for different light, a thickness of the second semiconductor material layer 142 can be determined according to the refractive indices of the substrate 10, the first semiconductor material layer 12, the second semiconductor material layer 142, and the bottom-next layer 144.

Please refer to FIG. 1 and FIG. 4A to FIG. 4D together. FIG. 4A to FIG. 4D is a section view illustrating a section view illustrating a method for fabricating a semiconductor light-emitting device 1 according to another embodiment of the invention.

Figure 4A:
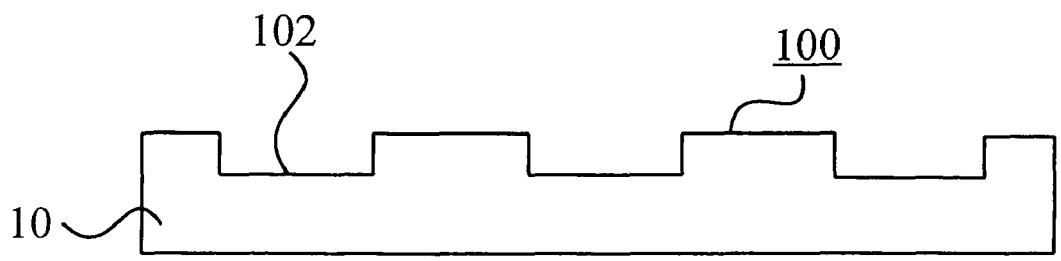
FIG. 4A to FIG. 4D is a section view illustrating a section view illustrating a method for fabricating a semiconductor light-emitting device according to another embodiment of the invention.

At first, as shown in FIG. 4A, a substrate 10 is prepared in the method. The substrate 10 has a first upper surface 100 and a plurality of recesses 102 formed on the first upper surface 100.

Figure 4B:
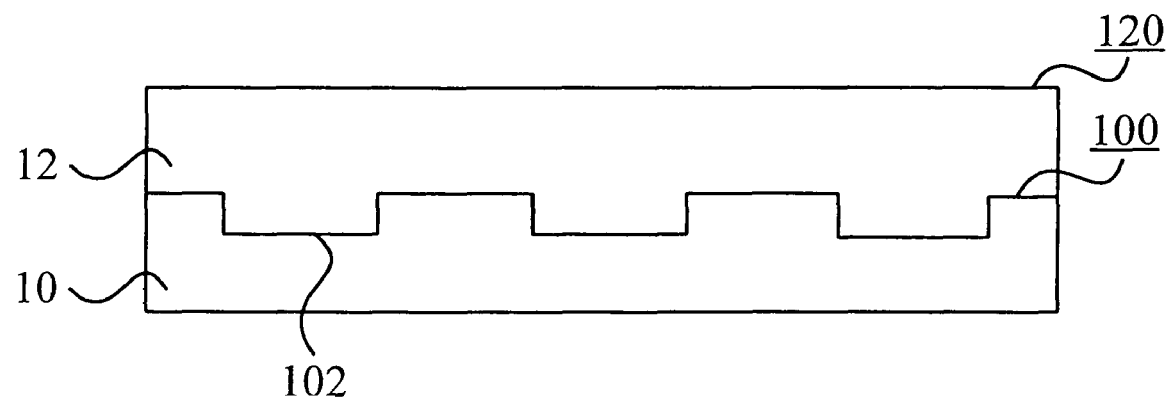

Afterwards, as shown in FIG. 4B, a first semiconductor material layer 12 is formed on the first upper surface 100 of the substrate 10 in the method. The first semiconductor material layer 12 has a second upper surface 120.

Figure 4C:
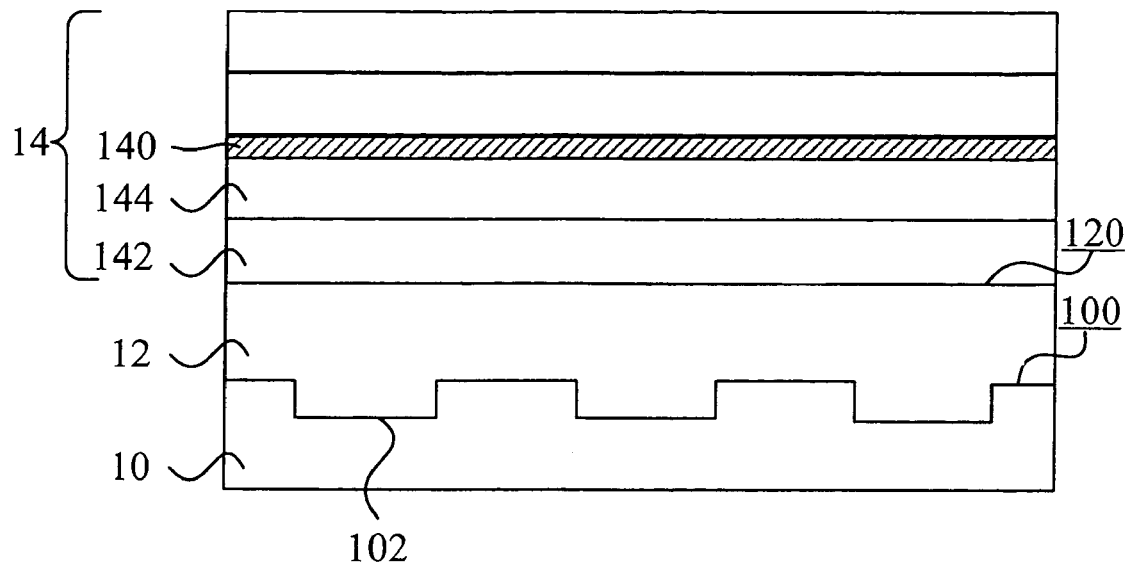

And then, as shown in FIG. 4C, a multi-layer structure 14 is formed on the second upper surface 120 of the first semiconductor material layer 12 in the method. The multi-layer structure 14 includes a light-emitting region 140.

Figure 4D:
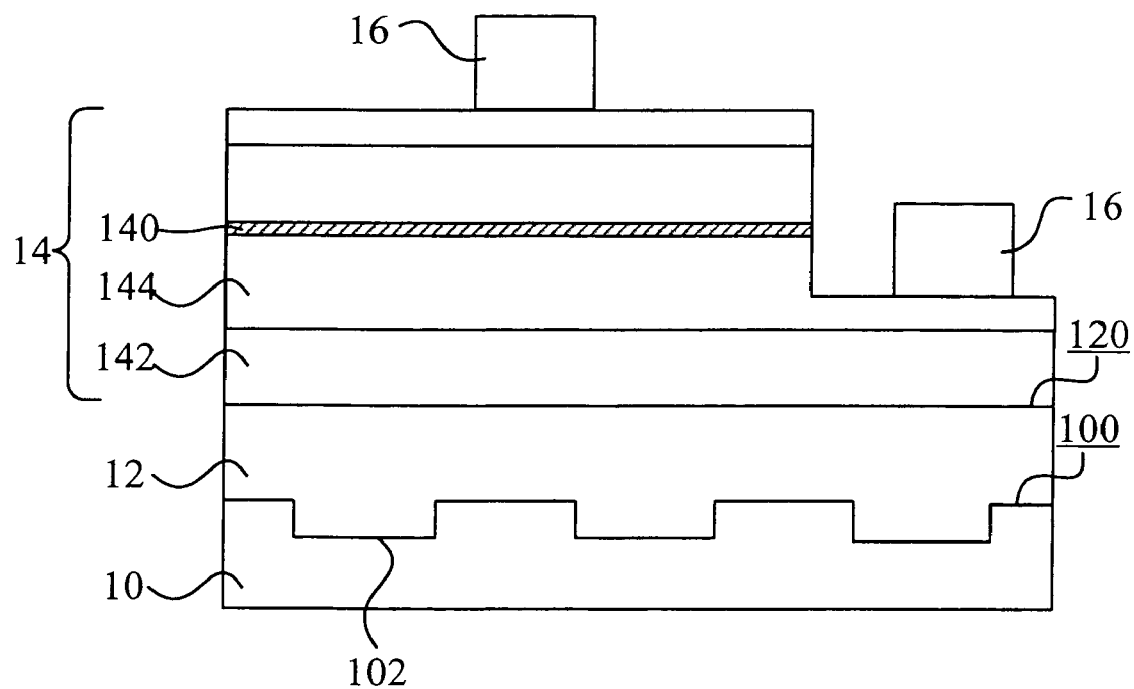

At last, as shown in FIG. 4D, an ohmic electrode structure 16 is formed on the multi-layer structure 14 in the method.

Particularly, the refractive index of the first semiconductor material layer 12 is different from those of the substrate 10 and the bottom-most layer of the multi-layer structure 14.

In an embodiment, the bottom-most layer of the multi-layer structure 14 can be regarded as a second semiconductor material layer 142. Similarly, the refractive index the second semiconductor material layer 142 is different from those of a bottom-next layer 144 of the multi-layer structure 14 and the first semiconductor material layer 12.

Figure 5:
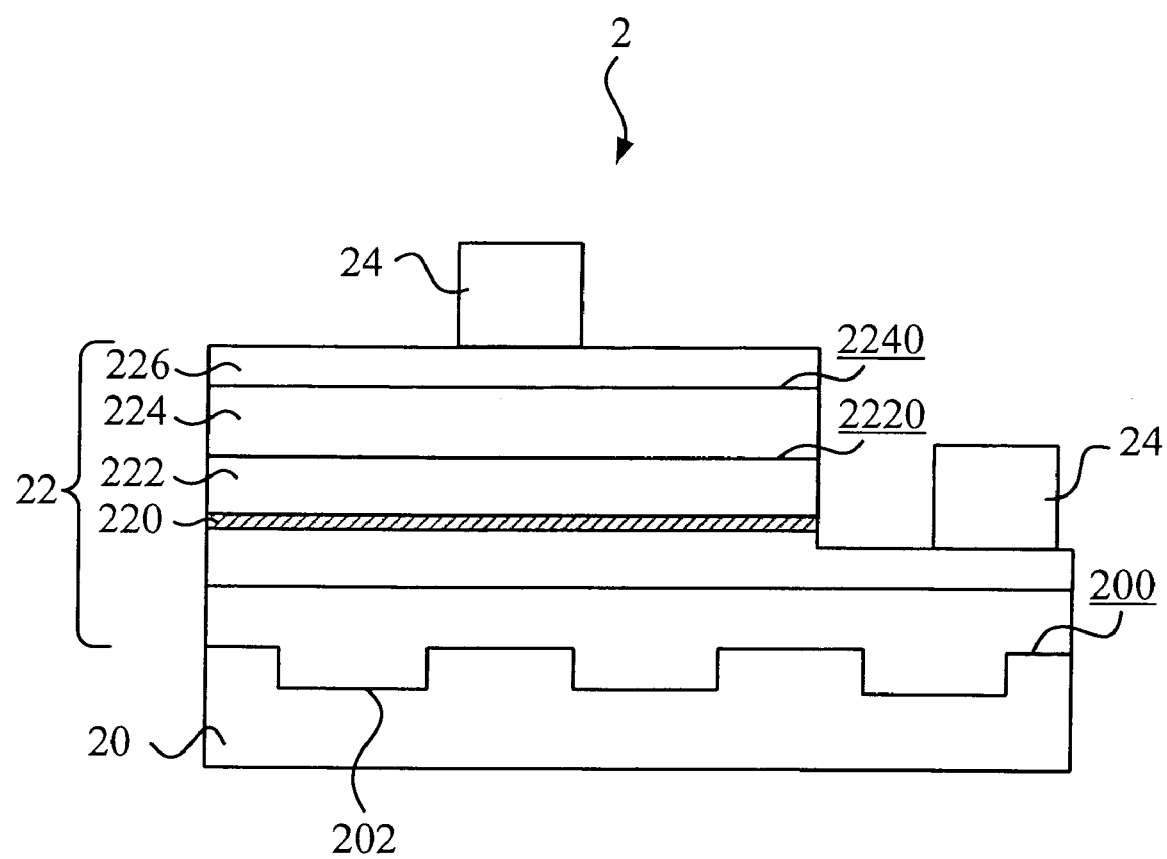
FIG. 5 is a section view illustrating a semiconductor light-emitting device according to another embodiment of the invention.

Please refer to FIG. 5. FIG. 5 is a section view illustrating a semiconductor light-emitting device 2 according to another embodiment of the invention.

As shown in FIG. 5, the semiconductor light-emitting device 2 includes a substrate 20, a multi-layer structure 22 and an ohmic electrode structure 24.

The substrate 20 has a first upper surface 200 and a plurality of recesses 202 formed on the first upper surface 200. The multi-layer structure 22 is formed on the first upper surface 200 of the substrate 20. The multi-layer structure 22 includes a light-emitting layer 220, a first semiconductor material layer 222, and a second semiconductor material layer 224. The first semiconductor material layer 222 is formed on light-emitting layer 220 and has a second upper surface 2220. The second semiconductor material layer 224 is formed on the first semiconductor material layer 222 and has a third upper surface 2240. The ohmic electrode structure 24 is formed on the multi-layer structure 22.

In an embodiment, the first semiconductor material layer 222 and the second semiconductor material layer 224 can be a II-V group compound, a II-VI group compound, or a III-V group compound.

Particularly, the refractive index of the first semiconductor material layer 222 is different from those of the light-emitting layer 220 and the second semiconductor material layer 224. The differences among the refractive indices of the light-emitting layer 220, the first semiconductor material layer 222 and the second semiconductor material layer 224 are for changing the moving direction of the light emitted from the light-emitting layer 220 to decrease total reflection probability, so as to prevent the light from being limited inside the semiconductor light-emitting device 2, in other words, to increase the light-extraction efficiency of the semiconductor light-emitting device 2.

Figure 6:
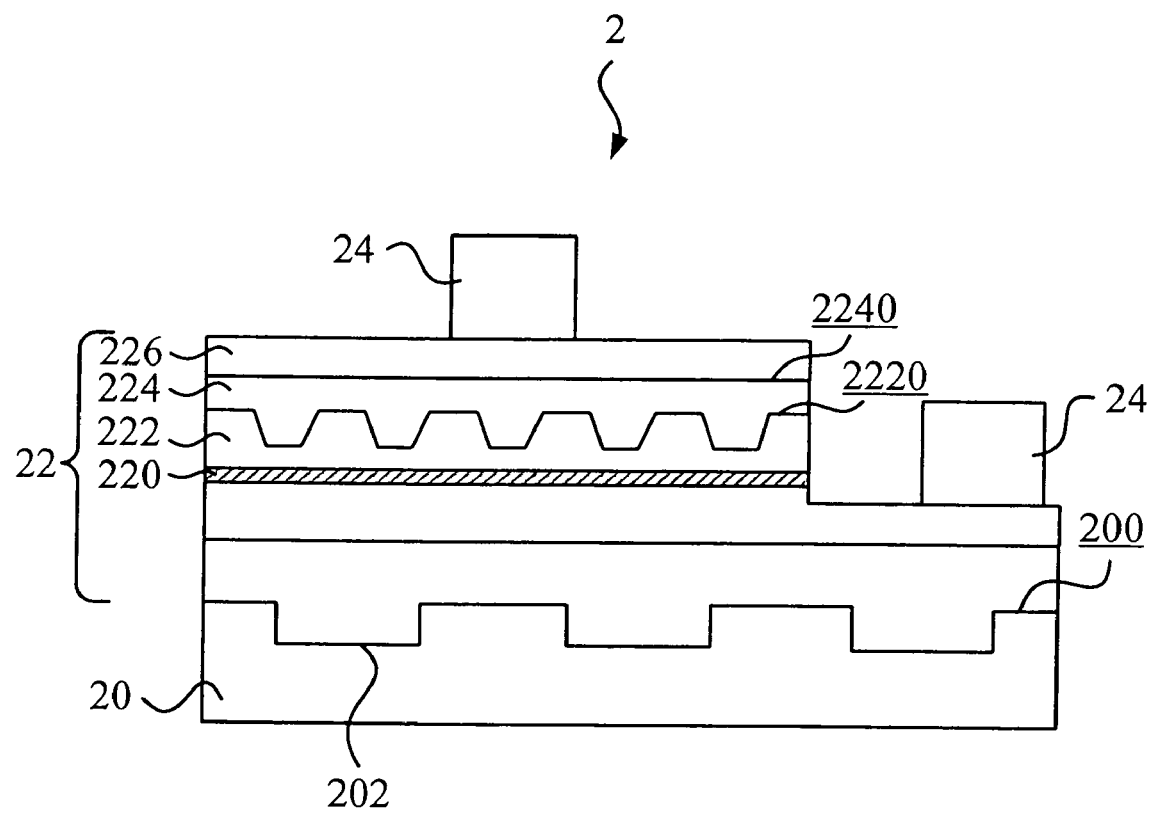
FIG. 6 is a section view illustrating a semiconductor light-emitting device according to another embodiment of the invention.

Please refer to FIG. 6. FIG. 6 is a section view illustrating a semiconductor light-emitting device 2 according to another embodiment of the invention.

As shown in FIG. 6, the second upper surface 2220 of the first semiconductor material layer 222 can further be rough. The rough second upper surface 2220 has the same function as above-mentioned and it is not described here.

In an embodiment, a thickness of the first semiconductor material layer 222 can be determined according to the refractive indices of the light-emitting layer 220, the first semiconductor material layer 222, and the second semiconductor material layer 224. The design of the thickness is used for achieving optimum light-extraction efficiency for different light.

Please refer to FIG. 5 again. As shown in FIG. 5, the multi-layer structure 22 further includes a third semiconductor material layer 226 formed on the third upper surface 2240 of the second semiconductor material layer 224. The third semiconductor material layer 226 can also be a II-V group compound, a II-VI group compound, or a III-V group compound.

Similarly, the refractive index the second semiconductor material layer 224 is different from those of a first semiconductor material layer 222 and the third semiconductor material layer 226.

On the basis of the same principle, the differences among the refractive indices of the light-emitting layer 220, the first semiconductor material layer 222, the second semiconductor material layer 224, and the third material layer 226 are used for increasing the light-extraction efficiency of the semiconductor light-emitting device 2.

Figure 7:
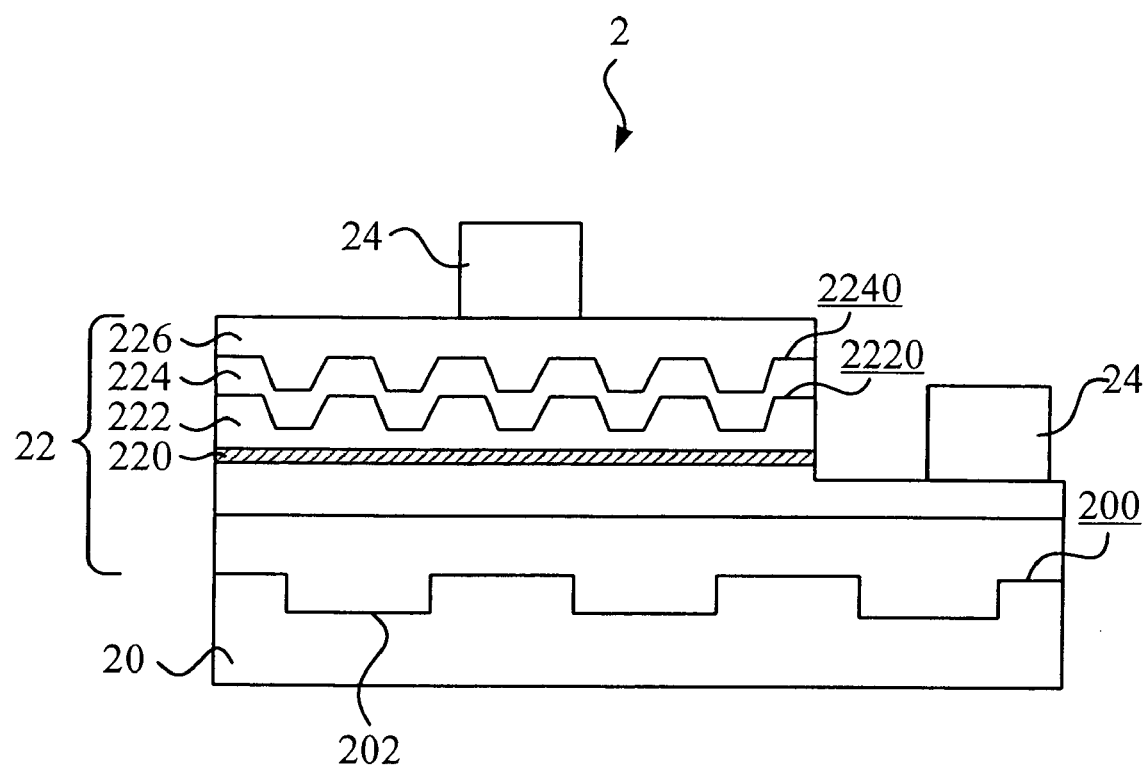
FIG. 7 is a section view illustrating a semiconductor light-emitting device extended from FIG. 6 according to another embodiment of the invention.

Please refer to FIG. 7. FIG. 7 is a section view illustrating a semiconductor light-emitting device 2 extended from FIG. 6 according to another embodiment of the invention.

As shown is FIG. 7, the third upper surface 2240 of the second semiconductor material layer 224 also can further be rough. In the aspect of function, the rough third upper surface 2240 also can further increase the refractive frequency of the light to change the moving direction thereof.

In an embodiment, similarly for the optimum light-extraction efficiency for different light, a thickness of the second semiconductor material layer 224 can be determined according to the refractive indices of the light-emitting layer 220, the first semiconductor material layer 222, the second semiconductor material layer 224, and the third semiconductor material layer 226.

Compared to the prior art, the semiconductor light-emitting device of the invention can change the moving direction of the light inside the semiconductor light-emitting device to decrease total reflection probability according to the different refractive indices among different semiconductor material layers. Accordingly, the light-extraction efficiency of the semiconductor light-emitting device of the invention can be increased efficiently.

While the invention has been described in some preferred embodiments, it is understood that the words which have been used are words of description rather than words of limitation and that changes within the purview of the appended claims may be made without departing from the scope and spirit of the invention in its broader aspect.

What is claimed is:

1. A semiconductor light-emitting device, comprising:
   an uneven substrate having a first upper surface;
   a first semiconductor material layer, formed on the first upper surface of the substrate, and the first semiconductor material layer having a second upper surface;
   a multi-layer structure, formed on the second upper surface of the first semiconductor material layer, and the multi-layer structure comprising a light-emitting region; and
   an ohmic electrode structure formed on the multi-layer structure;
   wherein the first semiconductor material layer has a refractive index different from those of the substrate and a bottom-most layer of the multi-layer structure to change a moving direction of a light emitted from the light-emitting region through the first semiconductor material layer.

2. The semiconductor light-emitting device of claim 1, wherein the bottom-most layer of the multi-layer structure is a second semiconductor material layer, and the second semiconductor material layer having a third upper surface, and the refractive index of the second semiconductor material layer being different from those of a bottom-next layer of the multi-layer structure and the first semiconductor material layer.

3. The semiconductor light-emitting device of claim 2, wherein each of the first semiconductor material layer and the second semiconductor material layer is formed of a material selected from the group consisting of a II-V group compound, a II-VI group compound, and a III-V group compound.

4. The semiconductor light-emitting device of claim 3, wherein a II group chemical element in the II-V group compound is one selected from the group consisting of Zn, Be, Mg, Ca, Sr, Ba, and Ra, and a V group chemical element in the II-V group compound is one selected from the group consisting of N, P, and As.

5. The semiconductor light-emitting device of claim 3, wherein a II group chemical element in the II-VI group compound is one selected from the group consisting of Zn, Be, Mg, Ca, Sr, Ba and Ra, and a VI group chemical element in the II-VI group compound is one selected from the group consisting of O, S, Se, Te and Po.

6. The semiconductor light-emitting device of claim 3, wherein a III group chemical element in the III-V group compound is one selected from the group consisting of Al, Ga and In, and a V group chemical element in the III-V group compound is one selected from the group consisting of N, P, and As.

7. The semiconductor light-emitting device of claim 1, wherein the second upper surface of the first semiconductor material layer is rough.

8. The semiconductor light-emitting device of claim 1, wherein the substrate is formed of a material selected from the group consisting of $SiO_2$, Si, Ge, GaN, GaAs, GaP, AlN, sapphire, spinnel, $Al_2O_3$, SiC, ZnO, MgO, $LiAlO_2$, $LiGaO_2$, and $MgAl_2O_4$.

9. A method for fabricating a semiconductor light-emitting device, the method comprising the following steps:
   preparing an uneven substrate having a first upper surface;
   forming a first semiconductor material layer on the first upper surface of the substrate, the first semiconductor material layer having a second upper surface;
   forming a multi-layer structure on the second upper surface of the first semiconductor material layer, the multi-layer structure comprising a light-emitting region; and
   forming an ohmic electrode structure on the multi-layer structure;

wherein the first semiconductor material layer has a refractive index different from those of the substrate and a bottom-most layer of the multi-layer structure to change a moving direction of a light emitted from the light-emitting region through the first semiconductor material layer.

10. The method of claim 9, wherein the bottom-most layer of the multi-layer structure is a second semiconductor material layer, and the second semiconductor material layer having a third upper surface, and the refractive index of the second semiconductor material layer being different from those of a bottom-next layer of the multi-layer structure and the first semiconductor material layer.

11. The method of claim 10, wherein each of the first semiconductor material layer and the second semiconductor material layer is formed of a material selected from the group consisting of a II-V group compound, a II-VI group compound, and a III-V group compound.

12. The method of claim 11, wherein a II group chemical element in the II-V group compound is one selected from the group consisting of Zn, Be, Mg, Ca, Sr, Ba, and Ra, and a V group chemical element in the II-V group compound is one selected from the group consisting of N, P, and As.

13. The method of claim 11, wherein a II group chemical element in the II-VI group compound is one selected from the group consisting of Zn, Be, Mg, Ca, Sr, Ba, and Ra, and a VI group chemical element in the II-VI group compound is one selected from the group consisting of O, S, Se, Te, and Po.

14. The method of claim 11, wherein a III group chemical element in the III-V group compound is one selected from the group consisting of Al, Ga, and In, and a V group chemical element in the III-V group compound is one selected from the group consisting of N, P, and As.

15. The method of claim 9, wherein the second upper surface of the first semiconductor material layer is rough.

16. The method of claim 9, wherein the substrate is formed of a material selected from the group consisting of $SiO_2$, Si, Ge, GaN, GaAs, GaP, AlN, sapphire, spinnel, $Al_2O_3$, SiC, ZnO, MgO, $LiAlO_2$, $LiGaO_2$, and $MgAl_2O_4$.

17. A semiconductor light-emitting device, comprising:
an uneven substrate having a first upper surface;
a multi-layer structure, formed on the first upper surface of the substrate, and the multi-layer structure comprising a light-emitting region, the multi-layer structure comprising a light-emitting layer, a first semiconductor material layer, and a second semiconductor material layer, the first semiconductor material layer being formed on the light-emitting layer and having a second upper surface, the second semiconductor material layer being formed on the first semiconductor material layer and having a third upper surface; and
an ohmic electrode structure formed on the multi-layer structure;
wherein the first semiconductor material layer has a refractive index different from those of the light-emitting layer and the second semiconductor material layer to change a moving direction of a light emitted from the light-emitting layer through the first semiconductor material layer.

18. The semiconductor light-emitting device of claim 17, wherein the multi-layer structure further comprises a third semiconductor material layer formed on the third upper surface of the second semiconductor material layer, and the second semiconductor material layer having a refractive index different from those of the first semiconductor material layer and the third semiconductor material layer.

19. The semiconductor light-emitting device of claim 18, wherein each of the first semiconductor material layer, the second semiconductor material layer, and the third semiconductor material layer is formed of a material selected from the group consisting of a II-V group compound, a II-VI group compound, and a III-V group compound.

20. The semiconductor light-emitting device of claim 19, wherein a II group chemical element in the II-V group compound is one selected from the group consisting of Zn, Be, Mg, Ca, Sr, Ba, and Ra, and a V group chemical element in the II-V group compound is one selected from the group consisting of N, P, and As.

21. The semiconductor light-emitting device of claim 19, wherein a II group chemical element in the II-VI group compound is one selected from the group consisting of Zn, Be, Mg, Ca, Sr, Ba and Ra, and a VI group chemical element in the II-VI group compound is one selected from the group consisting of O, S, Se, Te and Po.

22. The semiconductor light-emitting device of claim 19, wherein a III group chemical element in the III-V group compound is one selected from the group consisting of Al, Ga and In, and a V group chemical element in the III-V group compound is one selected from the group consisting of N, P, and As.

23. The semiconductor light-emitting device of claim 17, wherein the second upper surface of the first semiconductor material layer is rough.

24. The semiconductor light-emitting device of claim 17, wherein the substrate is formed of a material selected from the group consisting of $SiO_2$, Si, Ge, GaN, GaAs, GaP, AlN, sapphire, spinnel, $Al_2O_3$, SiC, ZnO, MgO, $LiAlO_2$, $LiGaO_2$, and $MgAl_2O_4$.

* * * * *